United States Patent
Kang et al.

(10) Patent No.: US 11,608,567 B2
(45) Date of Patent: Mar. 21, 2023

(54) CRUCIBLE FOR INGOT GROWER

(71) Applicant: SK SILTRON CO., LTD., Gumi-si (KR)

(72) Inventors: In Gu Kang, Gumi-si (KR); Do Yeon Kim, Gumi-si (KR); Young Jung Lee, Gumi-si (KR)

(73) Assignee: SK SILTRON CO., LTD., Gumi-si (KR)

( * ) Notice: Subject to any disclaimer, the term of this patent is extended or adjusted under 35 U.S.C. 154(b) by 0 days.

(21) Appl. No.: 16/943,892

(22) Filed: Jul. 30, 2020

(65) Prior Publication Data

US 2021/0032768 A1 Feb. 4, 2021

(30) Foreign Application Priority Data

Jul. 31, 2019 (KR) .................. 10-2019-0093071

(51) Int. Cl.
*C30B 15/10* (2006.01)
*C30B 29/06* (2006.01)

(52) U.S. Cl.
CPC .............. *C30B 15/10* (2013.01); *C30B 29/06* (2013.01)

(58) Field of Classification Search
CPC ................................ C30B 15/10; C30B 29/06
See application file for complete search history.

(56) References Cited

U.S. PATENT DOCUMENTS

| 8,992,682 | B2 | 3/2015 | Kato et al. | |
|---|---|---|---|---|
| 2002/0166503 | A1* | 11/2002 | Magras | C30B 15/10 |
| | | | | 117/100 |

FOREIGN PATENT DOCUMENTS

| CN | 102094235 A | 6/2011 |
|---|---|---|
| CN | 108330532 A | 7/2018 |
| CN | 208517581 U | 2/2019 |
| CN | 208899038 U | 5/2019 |
| JP | 56-32396 A | 4/1981 |
| JP | 07010686 A * | 1/1995 |
| JP | 07010686 A * | 1/1995 |
| JP | 08-48598 A | 2/1996 |
| JP | H10158089 A | 6/1998 |
| JP | 10-297992 A | 11/1998 |
| JP | 2009298652 A | 12/2009 |
| JP | 2011-32125 A | 2/2011 |
| JP | 2018-043890 A | 3/2018 |
| KR | 10-2008-0056406 A | 6/2008 |

(Continued)

OTHER PUBLICATIONS

Office Action, with English translation, dated Jan. 6, 2022, for corresponding Chinese Patent Application No. 202010759728.8 (15 pages).

*Primary Examiner* — Hua Qi
(74) *Attorney, Agent, or Firm* — Lewis Roca Rothgerber Christie LLP

(57) ABSTRACT

The present invention relates to a crucible for an ingot growing apparatus capable of increasing the life span of a graphite crucible. One embodiment of the present invention provides a crucible for an ingot growing apparatus including: a quartz crucible containing a silicon melt and having a lower surface part with a curved shape; a graphite crucible accommodating the quartz crucible and having a body shape divided into at least two parts with respect to a lower surface thereof; and an inner supporter supported between the lower surface of the quartz crucible and the graphite crucible.

7 Claims, 5 Drawing Sheets

(56) References Cited

FOREIGN PATENT DOCUMENTS

| | | |
|---|---|---|
| KR | 20-2009-0001417 | 2/2009 |
| KR | 20130110863 A * | 10/2013 |
| KR | 20130110863 A * | 10/2013 |
| KR | 10-2016-0016251 A | 2/2016 |
| WO | WO 2005/095680 A1 | 10/2005 |

* cited by examiner

CRUCIBLE FOR INGOT GROWER

CROSS-REFERENCE TO RELATED APPLICATIONS

This application claims priority to and the benefit of Korean Patent Application No. 10-2019-0093071, filed on 31 Jul. 2019, the disclosure of which is incorporated herein by reference in its entirety.

TECHNICAL FIELD

The present invention relates to a crucible for an ingot growing apparatus capable of increasing the life span of a graphite crucible.

BACKGROUND

As a diameter of a silicon wafer for manufacturing a semiconductor device increases, most of the silicon wafer is manufactured from a silicon single crystal ingot grown by the Czochralski (CZ) method.

In the CZ method, a silicon single crystal ingot having a desired diameter is grown by charging polysilicon into a crucible, heating the crucible by a heater which is a graphite heating element, and then contacting a seed crystal with a silicon melt formed as a result of melting so that crystallization occurs at an interface therebetween, and slowly pulling up the seed crystal while rotating it.

FIG. 1 is a side sectional view showing a crucible for an ingot growing apparatus according to the related art and a load distribution of a silicon melt.

As shown in FIG. 1, the crucible in the related art may be composed of a quartz crucible 10 containing a silicon melt and a graphite crucible 20 accommodating the quartz crucible 10, and the graphite crucible 20 may be composed of two bodies 21 and 22 divided vertically.

A lower portion of the graphite crucible 20 may be configured to be in a convex shape, wherein the lower portion of the graphite crucible 20 may be configured to be seated on an upper surface groove 30h of an external supporter 30, and the external supporter 30 may be rotationally driven by a crucible driver (not shown).

When polysilicon contained in the crucible configured as described above is heated, a silicon melt reacts with the quartz crucible 10 during melting of silicon to generate SiO gas.

Such SiO gas is exhausted from the inside of a chamber together with Ar gas to the outside of the chamber by a vacuum pump, but a part of it enters between the graphite crucible 20 and the quartz crucible 10, and SiO and C of the graphite crucible react with each other to proceed conversion of the graphite crucible 20 into SiC.

Since the SiC and C have significantly different coefficients of thermal expansion, a stress due to the difference in thermal expansion occurs during cooling/heating of the graphite crucible 20, and accordingly, the graphite crucible 20 becomes more and more fragile in durability to be cracked.

In addition, a SiC layer of the graphite crucible 20 and $SiO_2$ of the quartz crucible 10 react to generate SiO gas and CO gas, and the flow of the gases causes etching in the graphite crucible 20. Such cracks in the graphite crucible 20 shorten the life span of the graphite crucible 20 and deform a shape of the quartz crucible 10 located inside the graphite crucible 20.

Korean Laid-open Patent Publication No. 2008-056406 (filed on Dec. 18, 2006) discloses an apparatus for manufacturing a silicon single crystal ingot including a quartz crucible in which a piece of polycrystalline silicon is melted, a first crucible support integrally formed so as to surround the quartz crucible and preventing deformation of a shape of the quartz crucible, and a second crucible support (graphite crucible) formed so as to surround the first crucible support and divided into two or more parts.

The apparatus is configured such that the first crucible support made of a CCM material surrounds the quartz crucible, and the second crucible support (graphite crucible) divided into two or more parts surrounds the first crucible support, and accordingly, the deformation of the quartz crucible is controlled by the first crucible support.

As a diameter of an ingot increases, a load of a silicon melt during an ingot growing process acts largely, and the load of the silicon melt acts structurally to a lower surface and a side surface of the first crucible support and the graphite crucible.

Therefore, the first crucible support may be easily deformed under a large load, and there is a limit in preventing the deformation of the quartz crucible.

In addition, a large load also acts on a side surface of the graphite crucible divided into two or more parts so that a gap between the divided parts of the graphite crucible is parted, and a part of the quartz crucible penetrates between divided faces of the graphite crucible, and thus there is a problem that the gap between the divided parts of the graphite crucible is more parted and the life span of the crucible is shorten.

SUMMARY

Technical Problem

The present invention is directed to solving the above-described problems in the related art and providing a crucible for an ingot growing apparatus capable of increasing the life span of a graphite crucible.

Technical Solution

One embodiment of the present invention provides a crucible for an ingot growing apparatus including: a quartz crucible containing a silicon melt and having a lower surface part with a curved shape; a graphite crucible accommodating the quartz crucible and having a body shape divided into at least two parts with respect to a lower surface thereof; and an inner supporter supported between the lower surface of the quartz crucible and the graphite crucible.

The inner supporter may be provided with a rounded upper surface groove on which the lower surface part of the quartz crucible is seated.

The graphite crucible may be connected to a side surface part with a cylindrical shape supporting a side surface of the quartz crucible and a side surface of the inner supporter, and to a lower end of the side surface part.

A gas discharge flow path for discharging a gas generated between the quartz crucible and the graphite crucible to the outside of the graphite crucible may be further included.

The gas discharge flow path may be provided in plural by a predetermined distance along a circumferential direction of the graphite crucible.

The gas discharge flow path may include a slit formed on an inner circumferential surface of the graphite crucible or an outer circumferential 1 surface of the inner supporter.

The gas discharge flow path may include an outlet passing through the lower surface of the graphite crucible so as to communicate with the slit.

An outer supporter supporting a lower portion of the graphite crucible may be further included.

The outlet may be provided outside the outer supporter.

Advantageous Effects

A crucible for ingot growing apparatus according to the present invention, when a quartz crucible is accommodated inside a graphite crucible divided into at least two bodies, an inner supporter having one body shape may be supported between a lower surface of the quartz crucible and the graphite crucible, and the bodies of the graphite crucible is prevented from being parted by the inner supporter, thereby increasing the life span of the crucible.

In addition, even though a gas is inflowed between the quartz crucible and the graphite crucible, or a gas is generated between the quartz crucible and the graphite crucible, the gas is allowed to discharge to the outside via slits of the inner supporter and an outlet of the graphite crucible, thereby increasing durability of the graphite crucible and preventing etching of the graphite crucible.

DETAILED DESCRIPTION OF THE EMBODIMENTS

Hereinafter, the present embodiments will be described in detail with reference to the accompanying drawings.

Figure 1:
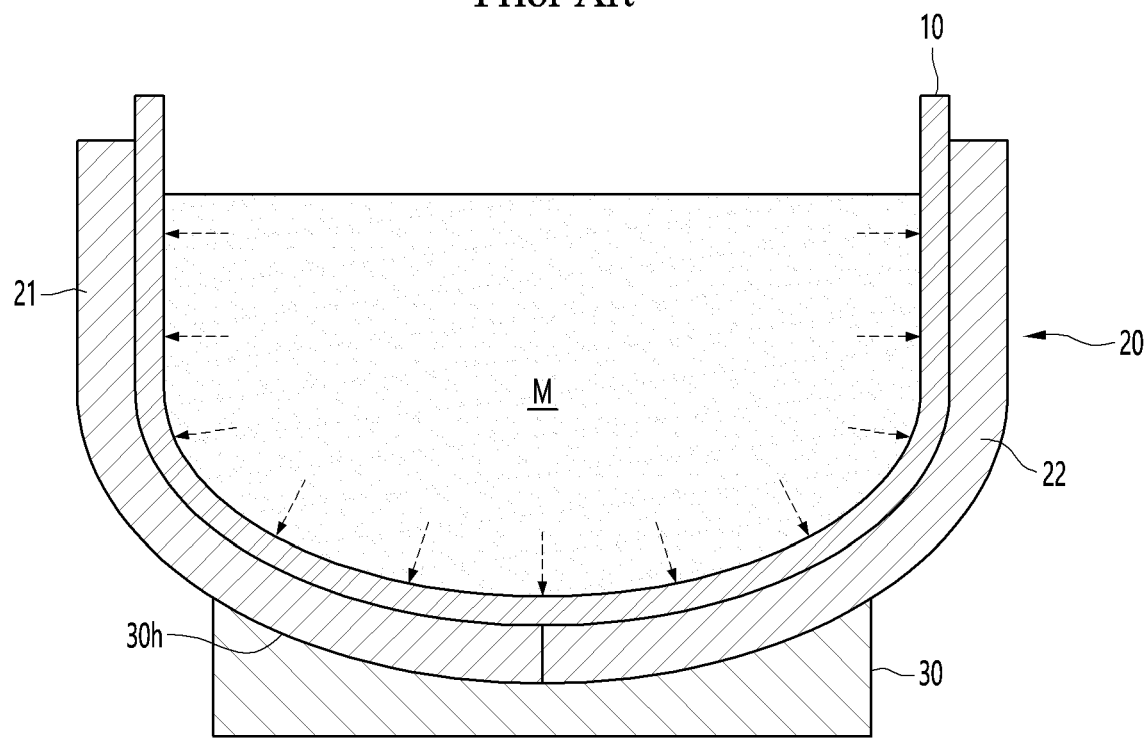
FIG. 1 is a side cross-sectional view showing a crucible for an ingot growing apparatus according to the related art and a load distribution of a silicon melt.
Figure 2:
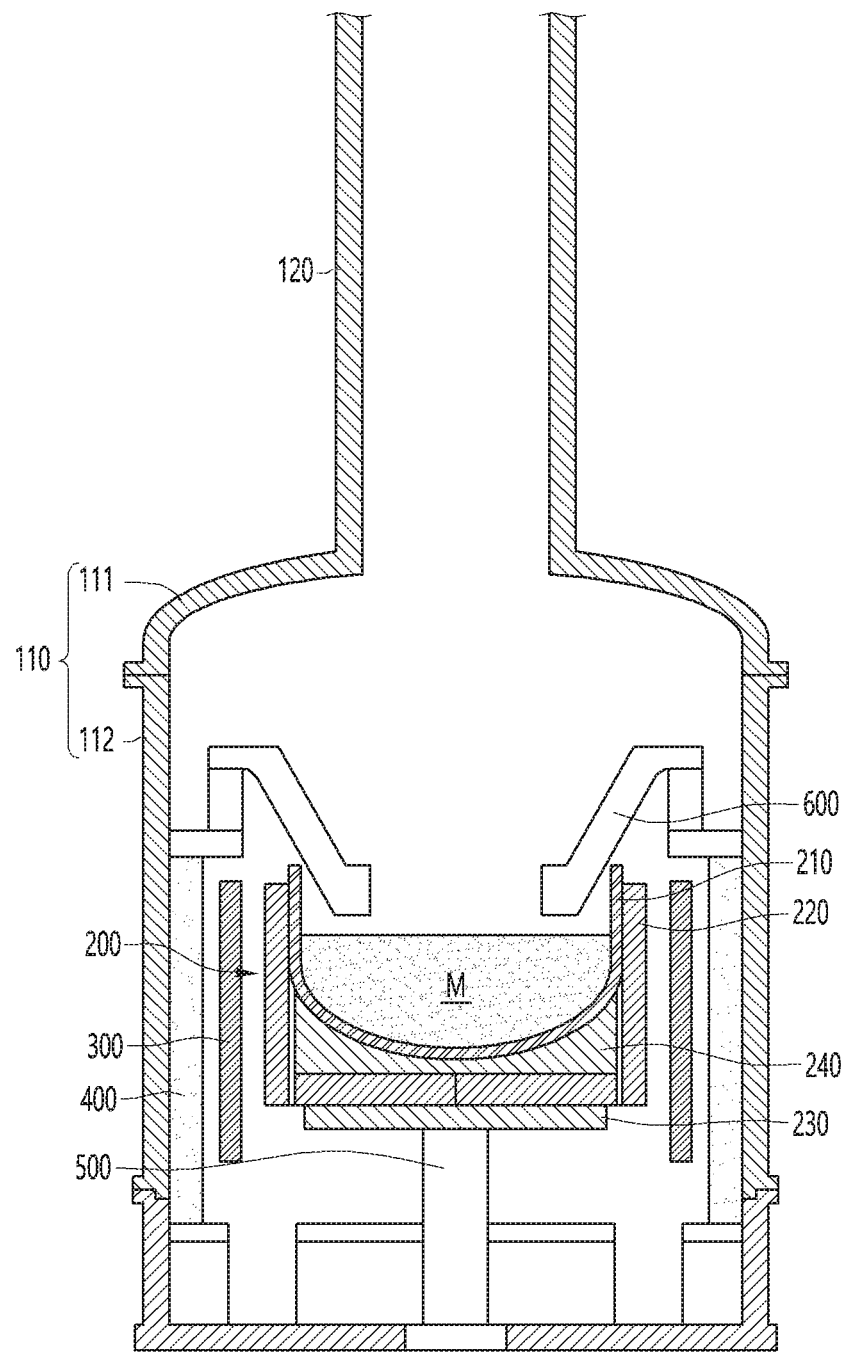
FIG. 2 is a side cross-sectional view showing an ingot growing apparatus of the present invention.

FIG. 2 is a side cross-sectional view showing an ingot growing apparatus of the present invention.

As shown in FIG. 2, the ingot growing apparatus of the present invention may include a chamber 110 which is a closed space and a pulling furnace 120, a crucible 200 provided inside the chamber 110, a heater heating the crucible 200, a heat insulating material 400 preventing heat of the heater from discharging to the outside, a crucible driving unit 500 driving rotationally the crucible 200, and a heat shielding member 600 for cooling a single crystal ingot pulled up in the crucible 200.

The chamber 110 may provide a predetermined closed space in which the single crystal ingot is grown, and various components may be mounted inside/outside thereof.

The chamber 110 may include a cylindrical-shaped body 111 in which various components are embedded, and a dome-shaped cover 112 coupled to an upper side of the body 111, and the cover 112 is provided with a view port capable of observing an ingot growing process.

The pulling furnace 120 may have a long cylindrical shape in which the single crystal ingot may be pulled up, and may be provided above the chamber 110.

The crucible 200 may be provided inside the body 111, and may be installed rotatably inside the chamber 110 as a container containing a hot silicon melt M, and a detailed configuration will be described below.

The heater 300 may be a graphite heating element, and may be installed to be spaced apart from a circumference of the crucible 200 so as to be able to heat the crucible 200. When the heater 300 is operated, a polysilicon contained in the crucible 200 may be liquefied into a silicon melt, and the operation of the heater 300 may be adjusted to control a temperature of the silicon melt.

The heat insulating material 400 may be provided on an inner circumferential surface of the body 111, and may be disposed so as to be spaced apart from a circumference of the heater 300, and thus it is possible to prevent the heat of the heater 300 from discharging to the outside through the body 111.

The crucible driving unit 500 may be provided below the crucible 200, and may rotate and elevate the crucible 200. The crucible driving unit 500 may include a drive shaft, a drive motor, and the like.

When a seed crystal is dipped in the silicon melt M and the crucible driving unit 500 slowly rotates the crucible 200, a single crystal may be grown around the seed crystal, and when the seed crystal is slowly pulled up, a diameter of the single crystal may be gradually increased to be grown into the single crystal ingot. As the silicon melt M contained in the crucible 200 decreases as the ingot growing process progresses, the crucible driving unit 500 may elevate gradually the crucible 200, and a height of an interface of the silicon melt M may be maintained constant.

That is, as the ingot growing process progresses, a rotational speed and an elevating speed of the crucible 200 may be controlled by controlling an operation of the crucible driving unit 500.

The heat shielding member 600 may be installed so as to hang above the crucible 200, and may immediately cool the ingot grown from the hot silicon melt M. The heat shielding member 600 is made of a graphite material capable of withstanding a high temperature, and a cooling flow path (not shown) may be provided inside thereof.

A lower portion of the heat shielding member 600 may be disposed so as to surround a circumference of the single crystal ingot grown from the silicon melt M contained in the crucible 200 at a predetermined distance, and may be installed so as to maintain a predetermined distance from the interface of the silicon melt M.

Figure 3:
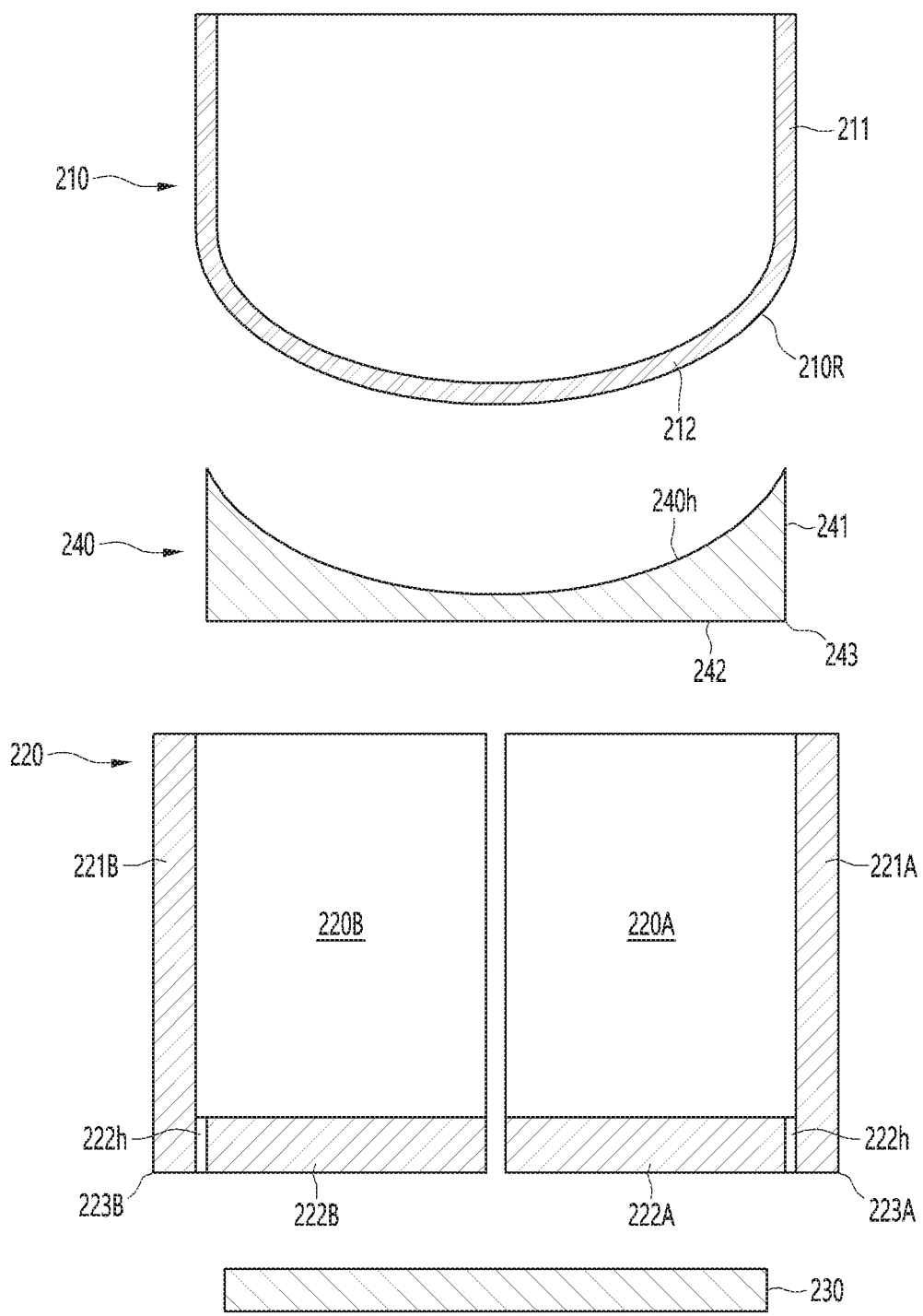
FIG. 3 is an exploded side cross-sectional view showing an example of a crucible applied to FIG. 2.
Figure 4:
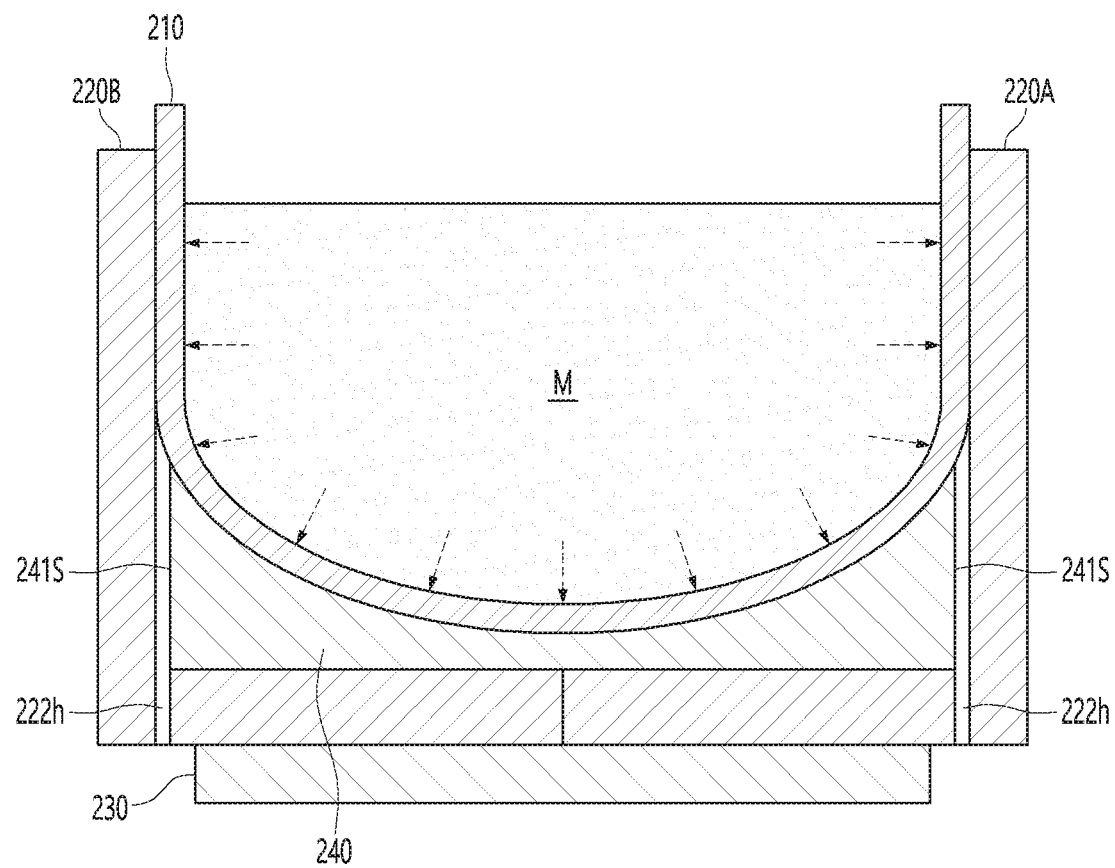
FIG. 4 is a side cross-sectional view showing the crucible applied to FIG. 2 and a load distribution of a silicon melt.
Figure 5:
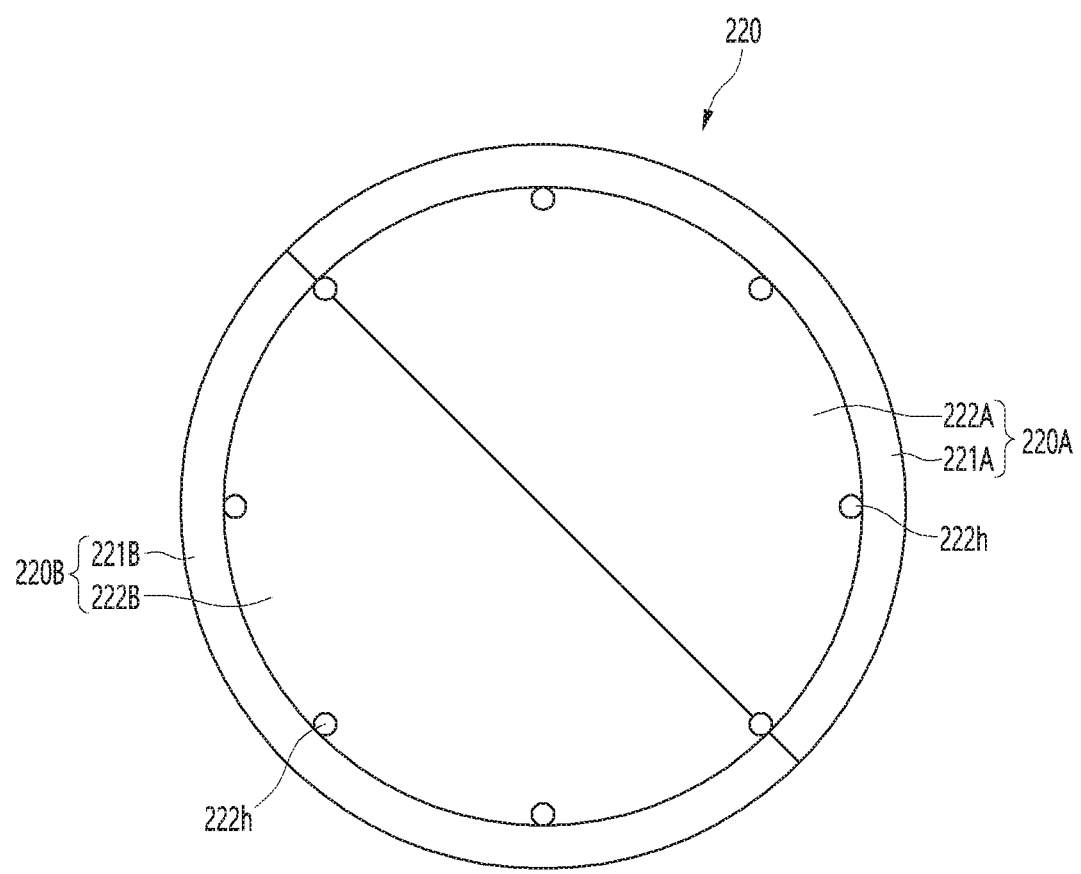
FIG. 5 is a plan view showing a graphite crucible of the crucible applied to FIG. 2.

FIG. 3 is an exploded side cross-sectional view showing an example of a crucible applied to FIG. 2, FIG. 4 is a side cross-sectional view showing the crucible applied to FIG. 2 and a load distribution of a silicon melt, and FIG. 5 is a plan view showing a graphite crucible of the crucible applied to FIG. 2.

The crucible 200 of the present invention may include a quartz crucible 210, a graphite crucible 220, an outer supporter 230, and an inner supporter 240 as shown in FIGS. 3 to 5.

The quartz crucible 210 is a container containing a silicon melt and is made of a quartz material, and accordingly, even though an oxide component is included in the silicon melt while the quartz crucible is partially melted at a high temperature, the quality of the single crystal ingot may not be affected.

The quartz crucible 210 is composed of a cylindrical-shaped side surface part 211 and a lower surface part 212 provided on a lower side of the side surface part 211, and may include a curved surface part 210R that connects loosely between the side surface part 211 and the lower surface part 212.

The graphite crucible 220 accommodates the quartz crucible 210, is made of a graphite material that may maintain its shape under a high temperature, and may be composed in a form of first and second bodies 220A and 220B that are divided into two parts vertically.

The first body 220A may be composed of a semi-cylindrical-shaped first side surface part 221A, and a semi-disc-shaped first lower surface part 222A provided below the first side surface part 221A, and the second body 220B may also be composed of a second side surface part 221B and a second lower surface part 222B that are symmetrical to the first side surface part 221A and the first lower surface part 222A.

The first and second bodies 220A and 220B are engaged with each other on both sides to form the graphite crucible 220. That is, the graphite crucible 220 is composed of the side surface parts 221A and 221B that form a cylindrical shape when assembled with each other, and the lower surface parts 222A and 222B that form a disk shape when assembling each other and provide below the side surface parts 221A and 221B, and may include lower corner parts 223A and 223B in which the side surface parts 221A and 221B and the lower surface parts 222A and 222B are connected in a square shape.

The outer supporter 230 having a flat plate shape that supports a lower side of the graphite crucible 220, may be made of a graphite material, and may be supported to be rotated or elevated by the crucible driving unit 500 (shown in FIG. 2).

The inner supporter 240 is supported between a lower portion of the quartz crucible 210 and the graphite crucible 220, has a form of a single body having a predetermined weight, and may be made of a graphite material.

The inner supporter 240 has a disk shape with a predetermined height so as to be seated inside the graphite crucible 220, and may include a side surface part 241 and a lower surface part 242. The inner supporter 240 may be formed higher than a height including the lower surface part 212 and the curved surface part 210R of the quartz crucible 210 at least, and a groove part 240h may be provided on an upper surface of the inner supporter 240 such that the lower surface part 212 and the curved surface part 210R of the quartz crucible 210 are seated.

The side surface part 241 and the lower surface part 242 of the inner supporter 240 may be supported inside the side surface parts 221A and 221B and the lower surface parts 222A and 222B of the graphite crucible 220, and a lower corner part 243 of the inner supporter 240 may be configured to be engaged with the lower corner parts 223A and 223B of the graphite crucible 220.

A gas discharge flow path for discharging a gas generated between the quartz crucible 210 and the graphite crucible 220 may be provided, and it may be provided inside the side surface parts 221A and 221B of the graphite crucible 220 or outside the side surface part 241 of the inner supporter 240.

According to the embodiment, the gas discharge flow path may include a slit 241S that is provided to be long vertically on an outer circumferential surface of the side surface part 241 of the inner supporter 240 and an outlet 222h passing through the lower surface parts 222A and 222B of the graphite crucible 220 so as to communicate with the slit 241S, and the slit 241S and the outlet 222h may be provided in plural at a predetermined distance in a circumferential direction, and may be provided so as to have a diameter of 1 mm to 100 mm.

The slit 241S may be provided to be long vertically on an inner circumferential surface of the side surface parts 220A and 220B of the graphite crucible 220, and since the outlet 222h should be provided so as not to be blocked by the outer supporter 230, it may be positioned outside the outer supporter 230.

The gas discharge flow path may be configured in various forms such as a slit, an outlet, and the like in the graphite crucible 220 and the inner supporter 240, and the embodiment is not limited thereto.

The graphite crucible 220, the outer supporter 230, and the inner supporter 240 may be divided into various forms to facilitate a process or control effectively deformation of the quartz crucible 210.

When reviewing the crucible configured as above, after the first and second bodies 220A and 220B are engaged with each other on both sides and the inner supporter 240 is seated on the first and second bodies 220A and 220B, the quartz crucible 210 is seated inside the first and second bodies 220A and 220B and above the inner supporter 240.

Of course, the slits 241S of the inner supporter 240 and the outlets 222h of the graphite crucible 220 are assembled so as to communicate with each other, respectively.

The side surface part 211 of the quartz crucible 210 and the side surface part 241 of the inner supporter 240 are supported inside the side surface parts 221A and 221B of the graphite crucible 220, the lower surface part 212 and the curved surface part 210R of the quartz crucible 210 are supported by the upper groove part 240h of the inner supporter 240, and the lower surface part 242 of the inner supporter 240 is supported above the lower surface part 212 of the quartz crucible 210.

For the ingot growing process, a weight of the silicon melt M acts as stress on the quartz crucible 210 in a state in which the silicon melt is contained inside the quartz crucible 210. However, even though the weight of the silicon melt M acts as stress on the side surface parts 221A and 221B of the graphite crucible 220, a weight of the inner supporter 240 added to the weight of the silicon melt M acts on the lower surface parts 222A and 222B of the graphite crucible 220 as gravity.

Therefore, it is possible to prevent a gap between the first and second bodies 220A and 220B configuring the graphite crucible 220 from being parted by dispersing the stress acting on the side surface parts 221A and 221B of the graphite crucible 220 in a gravity direction, and since a deformed portion of the quartz crucible 210 is prevented from being introduced to a divided surface between the first and second bodies 220A and 220B, the life span of the entire crucible may be extended.

In addition, even though a part of SiO gas is inflowed between the quartz crucible 210 and the graphite crucible 220 during the ingot growing process, the gas is allowed to discharge to the outside via the slits 241S of the inner supporter 240 and the outlets 222h of the graphite crucible 220.

Therefore, it is possible to prevent the SiO gas from reacting with C of the graphite crucible 220 to promote conversion of the graphite crucible 220 to SiC, thereby improving durability of the graphite crucible 220 and preventing etching of the graphite crucible 220.

The above-described descriptions are merely illustrative of the technological spirit of the present invention, and various modifications and variations may be made by those having ordinary skill in the art to which the present invention pertains without departing from the essential characteristics of the present invention.

Therefore, the embodiments disclosed in the present invention are not intended to limit the technological spirit of the present invention, but the embodiments are intended to describe, and the spirit and scope of the present invention is not limited by such embodiments.

The protection scope of the present invention should be construed by the following claims, and all technological spirits within the equivalent scope thereof should be construed as being included in the scope of right of the present invention.

DESCRIPTION OF REFERENCE NUMERALS

110: Chamber
120: Pulling furnace
200: Crucible
210: Quartz crucible
220: Graphite crucible
230: Outer supporter
240: Inner supporter

What is claimed is:

1. A crucible for an ingot growing apparatus comprising: a quartz crucible consisting of a cylindrical side surface part and a lower surface part with a curved shape connected to a lower end of the side surface part of the quartz crucible; a graphite crucible accommodating the quartz crucible and consisting of a cylindrical side surface part and a lower surface part connected orthogonally to a lower end of the cylindrical side surface part of the graphite crucible; an outer supporter supporting a lower portion of the graphite crucible; and an inner supporter supported between the lower surface part of the quartz crucible and the lower surface part of the graphite crucible, wherein the graphite crucible is divided into at least two parts vertically, the outer supporter has a plate shape that supports the lower surface of the graphite crucible, and the inner supporter has a disk shape with a predetermined height higher than a height of the lower surface part of the quartz crucible at least and has a rounded upper surface groove on which the entire lower surface part of the quartz crucible is seated.

2. The crucible for the ingot growing apparatus of claim 1, wherein the side surface part of the graphite crucible is supporting a side surface of the quartz crucible and a side surface of the inner supporter.

3. The crucible for the ingot growing apparatus of claim 1, further comprising
a gas discharge flow path for discharging a gas generated between the quartz crucible and the graphite crucible to the outside of the graphite crucible.

4. The crucible for the ingot growing apparatus of claim 3, wherein the gas discharge flow path is provided in plural by a predetermined distance along a circumferential direction of the graphite crucible.

5. The crucible for the ingot growing apparatus of claim 4, wherein the gas discharge flow path includes a slit formed on an inner circumferential surface of the graphite crucible or an outer circumferential surface of the inner supporter.

6. The crucible for the ingot growing apparatus of claim 5, wherein the gas discharge flow path includes an outlet passing through the lower surface part of the graphite crucible so as to communicate with the slit.

7. The crucible for the ingot growing apparatus of claim 6, wherein the outlet is provided outside the outer supporter.

* * * * *